US006943496B2

(12) United States Patent
Hishida

(10) Patent No.: US 6,943,496 B2
(45) Date of Patent: Sep. 13, 2005

(54) ELECTROLUMINESCENT DISPLAY DEVICE

(75) Inventor: Mitsuoki Hishida, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 123 days.

(21) Appl. No.: 10/388,602

(22) Filed: Mar. 17, 2003

(65) Prior Publication Data

US 2003/0214231 A1 Nov. 20, 2003

(30) Foreign Application Priority Data

Mar. 15, 2002 (JP) ........................................ 2002-072630

(51) Int. Cl.[7] .............................................. H01J 63/04
(52) U.S. Cl. ...................... 313/512; 313/498; 313/505; 313/506; 313/509
(58) Field of Search ................................ 313/498, 505, 313/506, 509, 512

(56) References Cited

U.S. PATENT DOCUMENTS 6,175,345 B1 * 1/2001 Kuribayashi et al. ......... 345/76
6,215,245 B1 * 4/2001 Mori ........................... 313/506
2001/0004113 A1   6/2001 Motomatsu

* cited by examiner

Primary Examiner—Vip Patel
(74) Attorney, Agent, or Firm—Morrison & Foerster LLP

(57) ABSTRACT

An electroluminescent display device includes a transparent substrate and an electroluminescent element disposed over the substrate. The electroluminescent element has a first electrode disposed over the substrate, a second electrode disposed over the first electrode and a light emitting layer disposed between the first and second electrodes. The display device also includes a thin film transistor driving the electroluminescent element, and a protection film disposed over the second electrode and being configured to prevent a penetration of moisture into the electroluminescent element. The second electrode is formed by evaporating aluminum so that the light emitting layer receives no damage, and the protection film is deposited by sputtering to provide a film with a high relative density so that moisture is prevented from entering the electroluminescent element.

18 Claims, 7 Drawing Sheets

ELECTROLUMINESCENT DISPLAY DEVICE

BACKGROUND OF THE INVENTION

1. Field of the Invention

This invention relates to an electroluminescent (EL) display device, specifically to an EL display device free from processing flaws.

2. Description of the Prior Arts

In recent years, EL display devices using EL elements have come to be known as display devices that can replace CRT and LCD. Research and development have been carried out on active matrix type EL display devices that include thin film transistors. (TFT) as switching elements for driving EL elements. The EL element includes an anode, a cathode and a light emitting layer disposed between the anode and cathode. However, the cathode, which is formed on the light emitting layer, is known to be prone to defect formation, leading to a poor production yield of the EL display device.

SUMMARY OF THE INVENTION

The invention provides an electroluminescent display device including a substrate and an electroluminescent element disposed over the substrate. The electroluminescent element includes a first electrode disposed over the substrate, a second electrode disposed over the first electrode and a light emitting layer disposed between the first and second electrodes. The display device also includes a thin film transistor driving the electroluminescent element, and a protection film disposed over the second electrode and being configured to prevent a penetration of moisture into the electroluminescent element.

The invention also provides an electroluminescent display device including a substrate and an electroluminescent element disposed over the substrate. The electroluminescent element includes a first electrode disposed over the substrate, a second electrode disposed over the first electrode and a light emitting layer disposed between the first and second electrodes. The display device also includes a thin film transistor driving the electroluminescent element, and a protection film disposed over the second electrode and having a relative density higher than a relative density of the second electrode.

The invention further provides a manufacturing method of an electroluminescent display device. The method includes providing a substrate, forming a first electrode over the substrate, and forming a light emitting layer over the first electrode. The method also includes forming a second electrode over the light emission layer, and depositing a protection film over the second electrode so that the protection film is not permeable to moisture.

The invention also provides a manufacturing method of an electroluminescent display device. The method includes providing a substrate, forming a first electrode over the substrate, and forming a light emitting layer over the first electrode. The method also includes forming a second electrode over the light emission layer, and depositing a metal on the second electrode to form a protection film so that a relative density of the protection film is higher than a relative density of the second electrode.

The invention further provides an electroluminescent display device including a substrate and a plurality of electroluminescent elements disposed over the substrate. Each of the electroluminescent elements includes an anode disposed over the substrate and a light emitting layer disposed over the anode. The display device also includes a cathode disposed over the light emitting layers of the electroluminescent elements, a thin film transistor disposed for each of the electroluminescent elements, and a protection film disposed over the cathode and being configured to prevent a penetration of moisture into the electroluminescent elements.

DETAILED DESCRIPTION OF THE INVENTION

Figure 1:
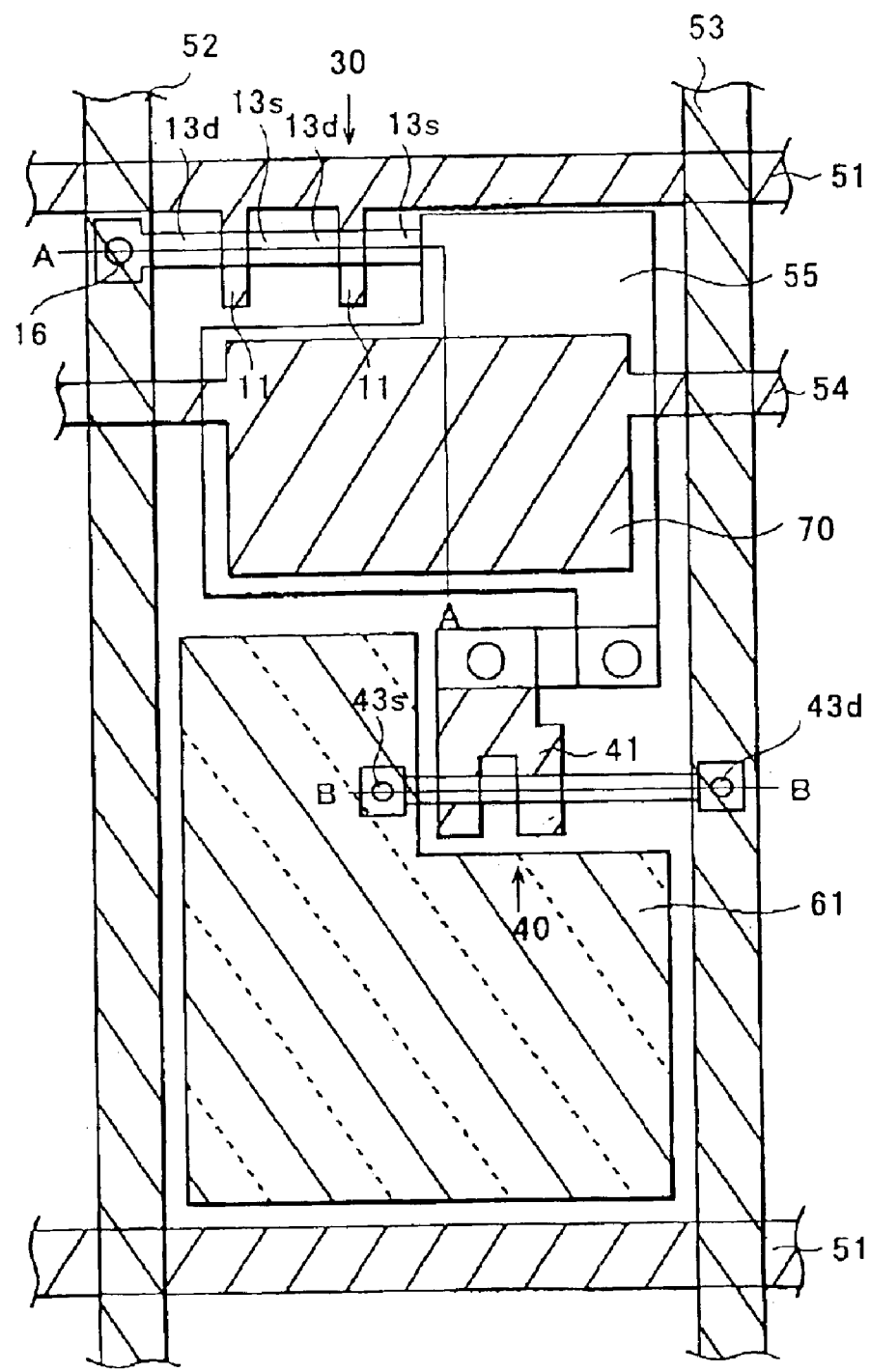
FIG. 1 is a plan view of an EL display device of an embodiment of this invention.
Figure 2:
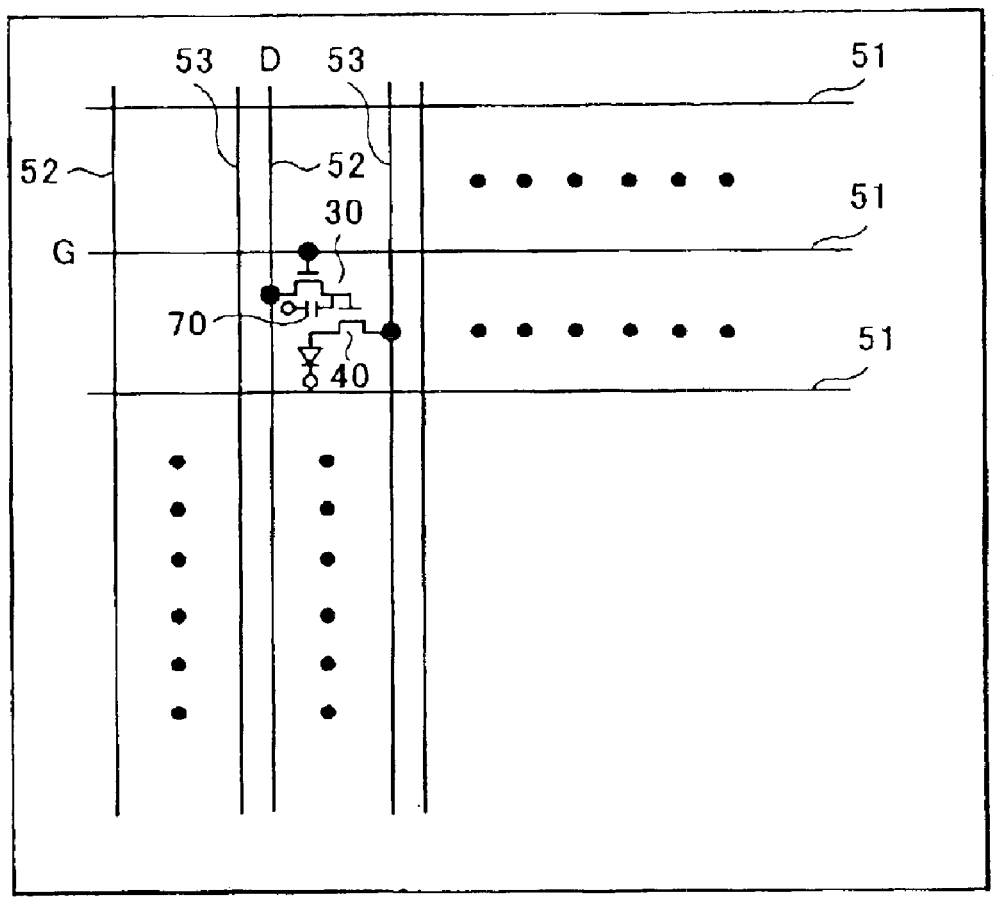
FIG. 2 is an equivalent circuit diagram of the device of FIG. 1.
Figure 3A:
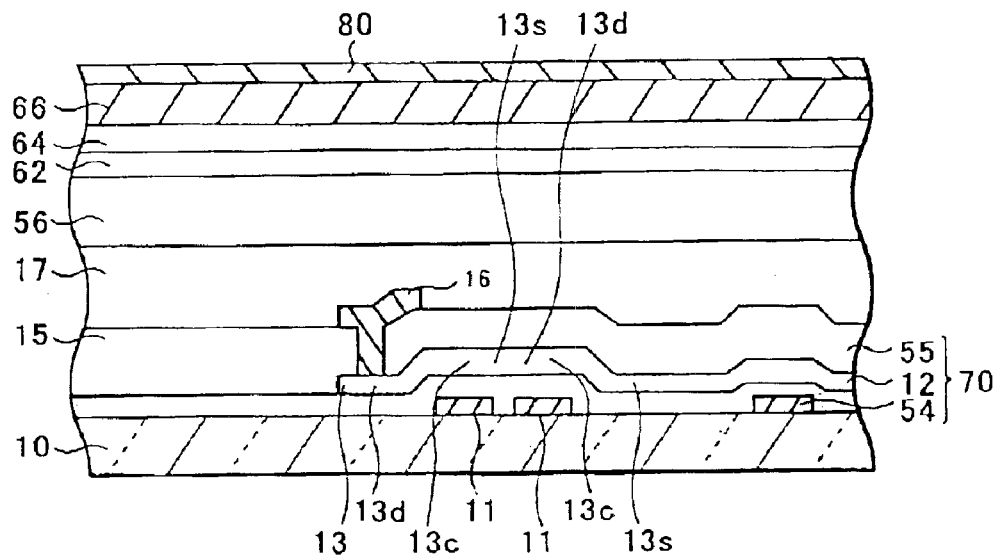
FIG. 3A is a cross-sectional view of the device of FIG. 1 cut along line A—A shown in FIG. 1.
Figure 3B:
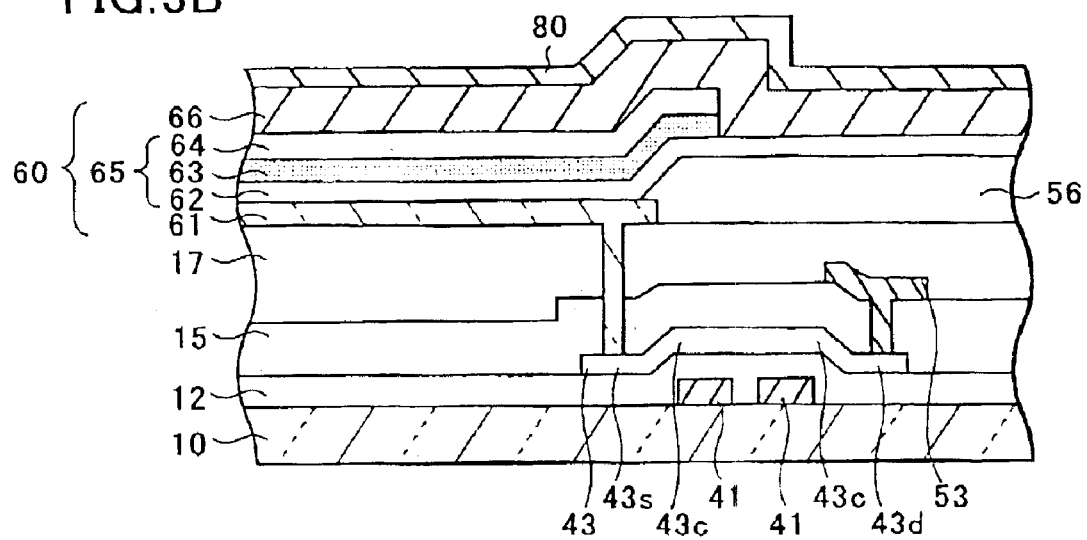
FIG. 3B is another cross-sectional view of the device of FIG. 1 cut along line B—B shown in FIG. 1.

An embodiment of this invention will be described with reference to FIGS. 1–7B. FIG. 1 is a plan view of one of the display pixels of an organic EL display device of this embodiment. FIG. 2 is an equivalent circuit diagram of the display pixel of FIG. 1. As shown in FIG. 2, the display pixels of the same configuration shown in FIG. 1 are arranged in a matrix to form the device. FIG. 3A is a sectional view along line A—A in FIG. 1, and FIG. 3B is a sectional view along line B—B in FIG. 1.

As shown in FIGS. 1 and 2, a display pixel is formed in a region surrounded by gate signal lines 51 and drain signal lines 52. A switching TFT 30, which is a switching element, is located near an intersection of the signal lines, and a source 13s of this TFT 30 serves at the same time as a capacitor electrode 55 that forms a capacitor 70 in combination with a holding capacitor electrode 54 and is connected to a gate electrode 41 of a driving TFT 40 that drives an organic EL element. A source 43s of the driving TFT 40 is connected to an anode 61 of the organic EL element and a drain 43d is connected to a driving power supply line 53 for driving the organic EL element.

A holding capacitor electrode 54, which runs parallel to gate signal line 51, is positioned near the TFTs. This holding capacitor electrode 54 is formed of chromium (Cr) or the like, and accumulates charges to form a capacitor 70 across a gate insulation film 12 together with the capacitor electrode 55 connected to source 13s of TFT 30. This holding capacitor is provided to hold a voltage that is applied to the gate electrode 41 of the driving TFT 40.

The switching TFT 30, which is the switching TFT, will be described.

As shown in FIG. 3A, the gate signal lines 51, which also serve as gate electrodes 11, and the holding capacitor electrode line 54 are made of a high melting point metal, such as Cr, molybdenum (Mo) and their alloys, and formed on an insulating substrate 10, formed of a quartz glass, a non-alkaline glass or the like.

The gate insulation film 12 and an active layer 13, formed of a polycrystalline silicon (p-Si) film, are formed in this order. The active layer 13 includes channels 13c disposed over the gate electrode. The sources 13s and the drains 13d are provided at both ends of each of the channels 13c. The active layer 13 may be of a LDD (Lightly Doped Drain) structure. In this structure, the channel 13c is sandwiched between low impurity regions, and the low impurity regions are further bordered with high impurity regions.

An interlayer insulation film 15, formed by laminating an $SiO_2$ film, an SiN film, and an $SiO_2$ film, in this order, is provided across the entire surface above the gate insulation film 12 and the active layer 13, and a drain electrode 16, which also serves as the drain signal line 52, is disposed by filling aluminum (Al) or other metal in a contact hole that is provided corresponding to the drain 13d. A planarization layer 17, which is formed, for example, of an organic resin and planarizes the surface, is provided on the entire surface. On top of this are laminated the respective organic materials 62 and 64 of an organic EL layer 65 and a cathode 66. To prevent tearing of an EL layer 65 due the stresses generated at the edge of the anode 61, another planarizing insulation film 56 is placed below a hole transport layer 62, as shown in FIGS. 3A and 3B. The cathode 66 made of Al or an aluminum alloy covers the layers of the organic materials 62, 64, and a protection film 80 made of a high melting point metal covers the aluminum layer 66. In this embodiment, the thickness of the cathode 66 is 4000 Å, and the thickness of the protection film 80 is 500 Å. The high melting point metal of this embodiment includes Mo and titanium (Ti), and is deposited on the aluminum layer 66 be a sputtering process.

The driving TFT 40, which supplies currents to the organic EL element, will now be described with reference to FIG. 3B.

The gate electrodes 41 are made of a high melting point metal, such as Cr, Mo and their alloys, and formed on an insulating substrate 10, formed of a quartz glass, a non-alkaline glass or the like. The gate insulation film 12 and an active layer 43, formed of p-Si film, are formed in this order. The active layer 43 includes channels 43c, which is made of intrinsic or substantially intrinsic p-Si, located above the gate electrodes 41. The source 43s and the drain 43d are formed by ion doping at both sides of the channels 43c.

The interlayer insulation film 15, formed by lamination of a $SiO_2$ film, a SiN film, and a SiO2 film, in this order, is provided across the entire surface above the gate insulation film 12 and the active layer 43, and the driving power supply line 53, which is connected to a driving power supply, is formed by depositing Al or other metal in a contact hole that is provided corresponding to the drain 43d. The planarization layer 17 is further provided across the entire surface, a contact hole is formed at positions of the planarization layer 17 and the interlayer insulation film 15 that correspond to the source 43s. The anode 61, which is made of ITO (indium tin oxide) or the like that contacts the source 43s via the contact hole, is placed on the planarization layer 17.

The organic EL element 60 has a structure formed by laminating the anode 61, the EL layer 65 and the cathode 66 made of Al. The EL 65 layer includes the hole transport layer 62, which has a first hole layer made of MTDATA (4,4',4"-tris(3-methylphenylphenylamino)triphenylamine), and a second hole transport layer made of TPD (N,N'-diphenyl-N,N'-di(3-methylphenyl)-1,1'-biphenyl-4,4'-diamine), a light emitting layer 63 made of Bebq2 (bis(10-hydroxybenzo[h]quinolinato) beryllium) that contains quinacridone, and an electron transport layer 64 formed of Bebq2. The cathode 66 is placed across the entire surface of substrate 10 that forms the organic EL display device shown in FIG. 1, and the protection film 80 covers the entire surface of the cathode 66. As is the case with the switching TFT 30, the thickness of the cathode 66 is 4000 Å, and the thickness of the protection film 80 is 500 Å.

In the organic EL element 60, holes injected from the anode 61 and electrons injected from the cathode 66 recombine inside the light emitting layer 63, thereby exciting organic molecules in the light emitting layer 63 to produce excitons. Light is emitted from the light emitting layer 63 as these excitons undergoes radiative dissipation, and this light is discharged to the exterior from the transparent anode 61 and through the transparent insulating substrate 10.

The light emitting layers 63 emit light of different colors based on the materials used for the light emission. These materials are deposited in the second hole transport layer by vapor deposition. In this embodiment, pixels corresponding to red (R), green (G) and blue (B) emission are formed, each of which has a structure shown in FIG. 1. Accordingly, the light emitting layers 63 are formed on the corresponding anodes 61, respectively.

In vapor depositing the light emitting materials of the respective colors, a material of a first color is vapor deposited using a metal mask that has openings corresponding to the matrix configuration, and this mask is moved transversely or longitudinally to perform vapor deposition of the other colors. This mask may be made of tungsten (W), silicon or the like.

Figure 4A:
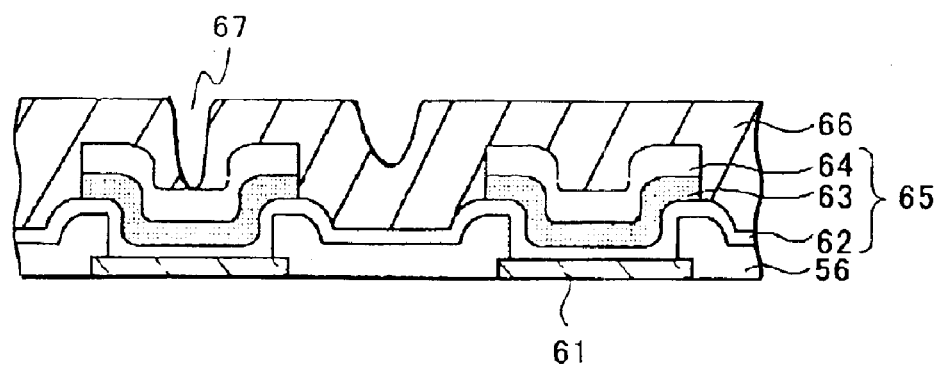
FIG. 4A is an expanded view of an EL layer and the related electrodes of a conventional EL display device.

Conventional EL display devices do not have the protection film 80 of this embodiment. Accordingly, as shown in FIG. 4A, since the aluminum layer, which forms the cathode 66, is formed by vapor deposition, the aluminum layer thus formed has a low relative density and is prone to defect formation. For example, when a metal mask is moved from one position corresponding to one color to another position corresponding to another color so that light emitting layers corresponding to each color are formed successively, the hole transport layer 62, on which the light emitting layers 63 are formed, may be damaged because of the movement of the mask. If Al is vapor deposited on the defective hole transport layer 62, the aluminum layer will also develop a defect 67 based on the defect in the hole transport layer 62, as shown in FIG. 4A. A typical example of such a defect 67 is a step or a pinhole. Even when there is no defect in the hole transport layer 62, the defects 67 in the aluminum layer are formed due to dust adsorption on the surface during the film forming process.

When there are defective parts in the aluminum layer of the cathode 66 as shown in FIG. 4A, the EL layer 65 below the defective part is exposed to ambient air and moisture enters the inside of the pixels. When moisture enters a pixel, not only does that pixel become defective and gives rise to a missing point defect, but the moisture that entered into the pixel also affects neighboring pixels successively, thereby causing dark spots, which are non-luminescent regions, to increase, and eventually, the entire panel may become unable to perform display functions. Such a defect of the cathode 66 can cause the above problem in the EL layer 65 even if it is, for example, about 0.3 $\mu$m in size. Accordingly, protecting the EL layer 65 from ambient air is thus essential.

The manufacturing of conventional EL display devices, in which the thickness of the cathode 66 is approximately 1000 Å, has been known to produce defective products dues to the problems described above. If just the aluminum layer itself is considered, the holes in the aluminum layer might be closed by aluminum reflow process. However, since the EL layer 65, which is formed prior to the cathode 66, is weak against heat treatment, the entire device intermediate cannot be heated. Accordingly, it has been difficult to improve the yield of manufacturing the conventional device.

In this embodiment, however, the protection film 80 prevents penetration of moisture into the pixels of the EL display device even when defects 67 are present in the aluminum layer of the cathode 66.

Figure 4B:
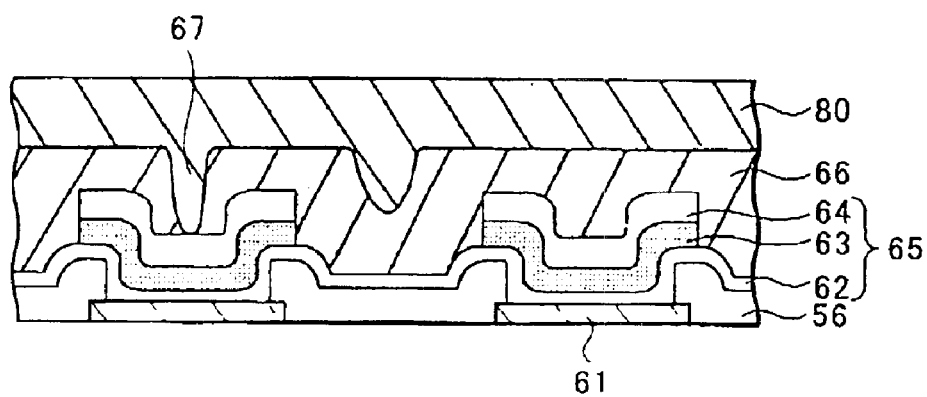
FIG. 4B is an expanded view of an EL layer and the related electrodes of the EL display device of FIG. 1.

FIG. 4B shows an expanded cross-sectional view of the cathode 66 and the protection layer 80 of this embodiment. The cathode 66 should be in direct contact with the organic EL layer 65. However, the cathode 66 should not be formed by spattering, because the sputtering may physically impact and partially remove the organic El layer 65.

Therefore, the cathode 66 must be formed by the evaporation of Al. The cathode 66 formed by evaporation rarely damages the EL layer 65. However, the relative density of the cathode 66 formed by evaporation is very low, and the soft cathode is much susceptible to the defect formation, as described above. Thus, the protection film 80, which is formed by sputtering and has a higher relative density than the cathode 66, is disposed over the cathode 66 and fills the defects 67. Accordingly, the moisture is prevented from entering the EL layer 65. A relative density is defined as a ratio of a density of a material formed to the theoretical density of the material, as widely understood in the art. In other words, the higher the relative density of a material is, the less porosity the material has. Furthermore, since the protection film 80 is made of a high melting point material, the protection film 80 is stable during heating treatments which the device intermediate undergoes after the formation of the protection film 80. Because the melting points of the high melting point metals are much higher than the temperature of the heating treatments, the crystalline structure of those metals remains intact and does not allow penetration of water molecule into the crystalline structure. Generally speaking, copper (Cu), which has a melting point of 1850° C., or any other metal that has a melting point higher than that of Cu, is effective in this regard.

The material for the protection film 80 is not limited to the a high melting point metals such as Mo and Ti. The materials with low moisture permeability such as $SiO_2$, SiNx, TEOS and acrylic resins can be also used. However, since the protection film 80 is deposited in order to block moisture, films containing moisture and films formed by coating and drying liquids containing moisture as a solvent are not preferable for use as the protection film 80. The film that can be deposited by sputtering or CVD is especially preferable as the protection film 80, because both the evaporation of the cathode 66 and the formation of the protection film 80 can be performed by a multiple-chamber coating apparatus without exposing them to the air between the two film formations. Forming of a high melting point metal by sputtering is effective in lowing manufacturing costs as well as achieving good step coverage. Such deposition methods are also capable of forming a fine film. A high melting point metal is especially preferable, because such metal is an electric conductor having a resistance lower than Al. Therefore, the metal can function as a part of the cathode 66, in which the defects 67 are filled by the high melting point metal. Mo is an excellent example of the high melting point metal. Titanium, Cr, W and alloys of these metals are also preferable. Among these metals, Mo is especially preferable because it is inexpensive and has a good affinity with Al. Since a protection film made of $SiO_2$ can be formed by RF sputtering, the use of this protection film may reduce the production cost. Because the cathode 66 has been already formed when the protection film 80 is being formed, the cathode 66 functions as a protection for the EL layer 65 during the formation of the protection film 80. Therefore, forming the protection film 80 by sputtering does not damage the EL layer 65.

Next, the thickness of the protection film 80 and its effect on protecting the EL layer 65 will be described. The protection film 80 with a thickness of 20 Å or greater is able to fill fine defects such as a pinhole. If the thickness of the protection film 80 is 200 Å or greater, it is very effective in suppressing the adverse effects of the defect formation due to dusts. A thickness of 500 Å or greater is preferable for flattening the surface. In general, the thicker the protection film 80 is, the more protection the film provides. However, the film may peel off due to the difference in elastic modulus between the protection film 80 and the cathode 66 made of Al when the protection film 80 is made of a high melting point metal. Therefore, the thickness of the protection film 80 is preferably equal to or smaller than about a half of the thickness of the cathode 66. Since the elastic modulus differs among materials, the thickness of the protection film 80 should be determined so that the stresses generated in the protection film 80 is equal to or smaller than the stresses generated in the cathode 66, i.e., $0.5 \times 10^9$ dyne/$cm^2$. In this embodiment, in which the thickness of the cathode 66 is 4000 Å, the upper limit of stress of the protection film 80 is set at $2 \times 10^4$ dyne/$cm^2$ and the film thickness is determined so as not to exceed this upper limit. The protection film 80 thicker than the cathode 66 may be formed if the stress of the protection film 80 is lower than that of the cathode 66. However, a high melting point metal film formed by sputtering normally has a high relative density, and thus generates a large stress. Therefore, thickness of the protection film 80 should be equal to or smaller than a half of the thickness of the cathode 66.

The thickness of the cathode 66 is 4000 Å in this embodiment. The preferable thickness range of the protection film 80 protecting this cathode 66 is between 250 Å and 2000 Å, with the most effective thickness being 500 Å. The thickness between 400 Å and 600 Å is equally effective in preventing the adverse effects due to the defect formation and the stress build-up in the protection film 80.

Figure 5:
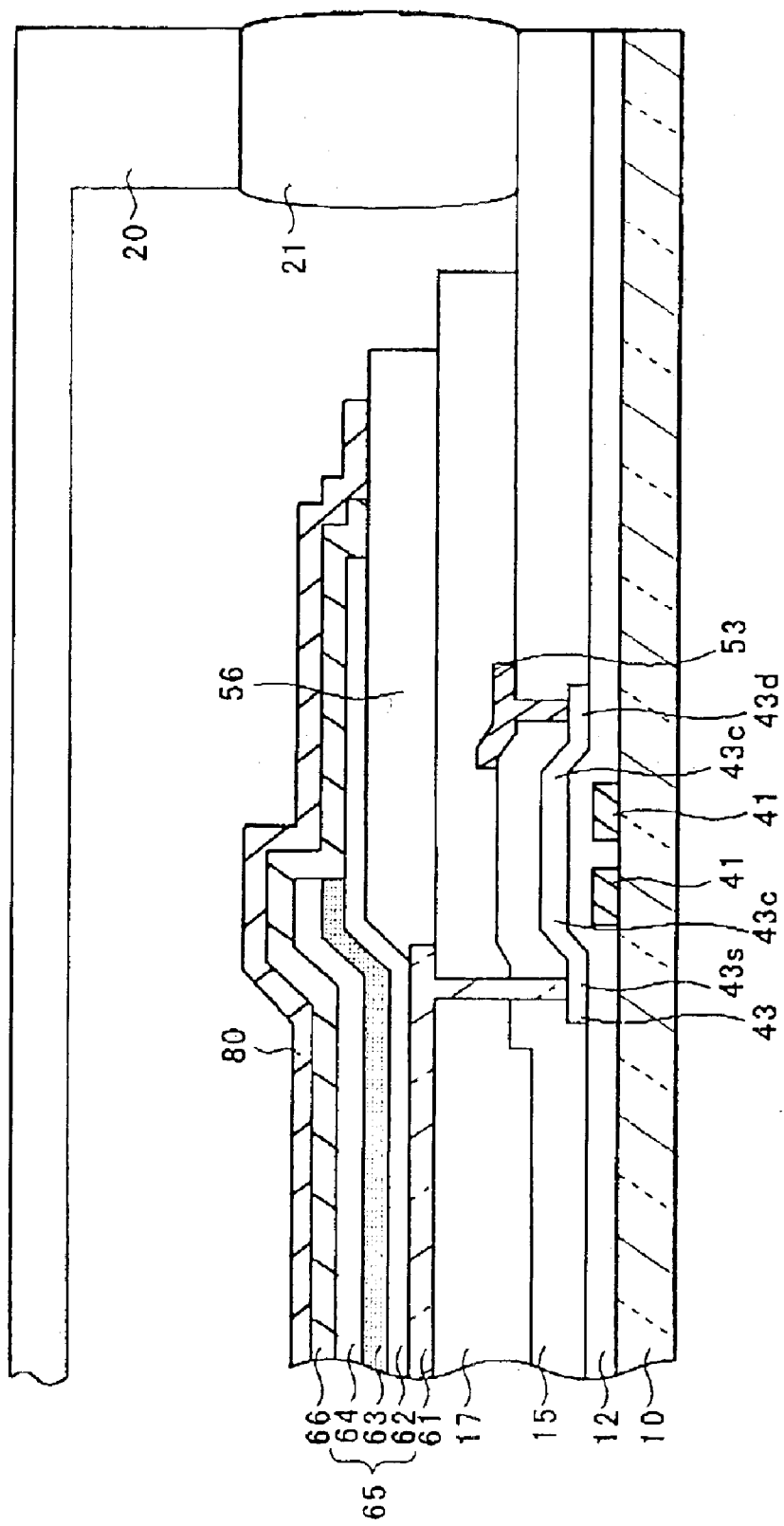
FIG. 5 is a cross-sectional view of the EL display device of FIG. 1 including the sealing structure of the device.

FIG. 5 is a cross-sectional view of the EL display device of this embodiment, which shows an edge portion of the protection film 80. The side edge of the EL layer 65 is covered by the cathode 66, and the side edge of the cathode 66 is then covered by the protection layer 80. A sealing substrate 20 is attached to the insulating substrate 10 using a sealing agent 21 to seal the pixels of the EL display device in the space between the sealing substrate 20 and the insulating substrate 10. In addition, a desiccant (not shown) is provided on the inside surface of the sealing substrate 20. Even though the conventional EL display devices include such moisture reducing measures, such as the sealing structure and the use of desiccant, a large amount of water is included in the device structure during the manufacturing process. This leads to the frequent dark spot formation in the convention EL display device. The protection film 80 of this invention substantially prevents the penetration of moisture into the EL layer 65, and significantly reduces the dark spot formation.

The inventors performed an experiment in which the thickness of the cathode 66 and the thickness of the protection film 80 were varied while keeping the rest of the structure of the display device the same as described above to evaluate the effect of the cathode thickness and the protection film thickness on the dark spot formation.

Figure 6A:
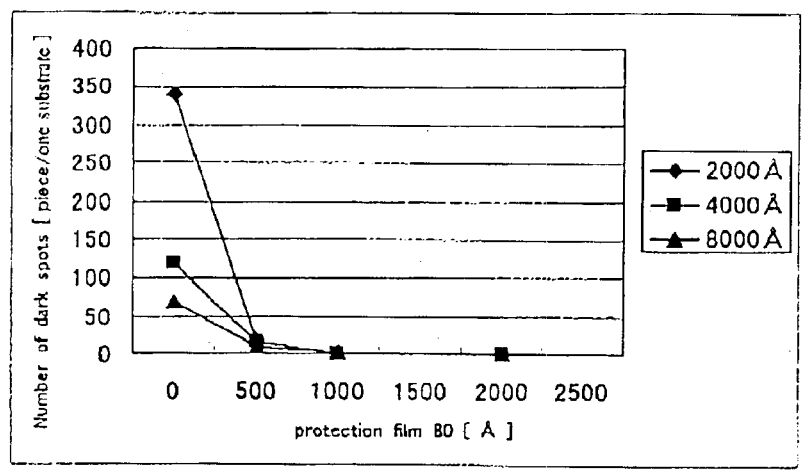
FIG. 6A shows the number of dark spots formed in the EL display device of FIG. 1 as a function of the thickness of the protection film.

FIG. 6A shows the correlation between the number of the dark spots in one substrate and the thickness of the protection film 80. Mo is used for the protection film 80 and Al is used for the cathode 66. The thickness of the cathode 66, in this embodiment, is 2000 Å, 4000 Å or 8000 Å, as shown in FIG. 6A.

When the protection film 80 is not provides, i.e., 0 Å thickness, the thicker the cathode 66 is, the smaller is the number of the dark spots. This is because some defects are filled by deposited Al itself during the evaporation of Al. When the protection film 80 having a thickness of 500 Å is deposited, the number of the dark spots drastically decreases to 10–30, regardless of the thick of the cathode 66. Furthermore, when the protection film 80 having a thickness of 1000 Å is deposited, the number of the dark spots decreases to a single digit or zero, although there is some variation among the substrates. When the protection film 80 having a thickness of 2000 Å is deposited, the dark spot is hardly observed in all the specimens. Therefore, the thickness of 1000 Å is highly effective in preventing the moisture penetration, and the thickness of 2000 Å is substantially enough to eliminate the dark spot formation, according to this experiment.

Although a thicker protection film 80 suppress more the defect formation, it requires longer sputtering, which leads to a reduced through put. Also, since the protection film 80 is made of a high melting point metal, the film stress increases as it becomes thicker, and the risk of peeling off of the protection film 80 from the cathode 66 underneath becomes larger. Therefore, the thickness of the high melting point metal layer should be smaller than that of the cathode 66, ideally smaller than a half of the thickness of the cathode 66, or the thickness which allows film stresses less than those of the cathode 66, as described above. The number of the dark spots is within the range practically acceptable for the device manufacturing when the protection film 80 with the thickness of 500 Å is deposited. The cathode 66 has the thickness of 4000 Å in this embodiment, which is much thicker than that of the conventional cathode thickness, i.e., about 1000 Å. Therefore, the thickness of the protection film 80 is effective even at 500 Å, because some of the defects of the cathode 66 may be cured by continuous deposition of Al.

Figure 6B:
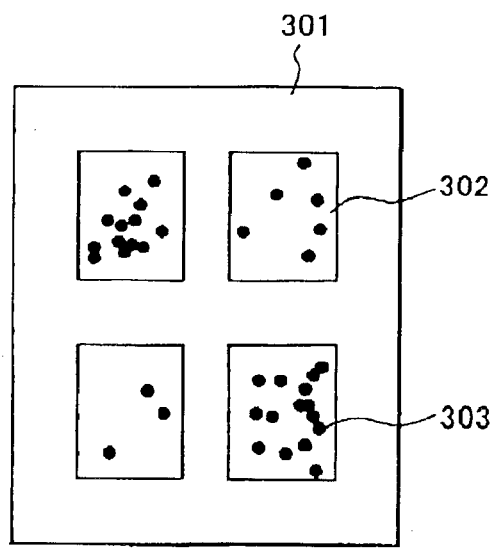
FIG. 6B shows the formation of dark spots in the conventional EL display device without the protection film.

Examples of the dark spot formation will now be described with reference to FIGS. 6B and. 6C. FIG. 6B shows the dark spots 303 that appeared in a display panel 302 formed on a mother glass 101, which had the same structure as the display device of this embodiment except that the display did not include the protection film. The thickness of the cathode of this device was 1000 Å. Many dark spots 303 were observed in each display panel 302.

Figure 6C:
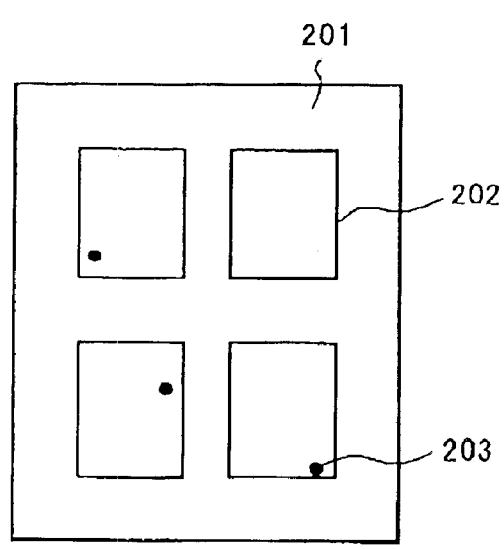
FIG. 6C shows the formation of dark spots in the EL display device of FIG. 1.

FIG. 6C shows the dark spots 203 of display panel 202 that is formed on a mother glass 201. This display panel 202 included the protection film 80 of this embodiment. The thickness of the protection film 80 of this display panel 202 was 500 Å, and the thickness of the cathode 66 of this display panel 202 was 4000 Å. The number of the dark spots is significantly reduced in all the four display panels 202 in comparison to the result of FIG. 6B. The display panel 202 on the upper right corner did not show any dark spot formation.

Next, the steps of manufacturing the EL display device of this embodiment will be described with reference to FIGS. 3A and 3B.

Firstly, the gate electrodes 11 of the switching transistor 30, the gate electrodes 41 of the driving transistor 40 and the holding capacitor electrode 54, which are made of a high melting point metal such as Cr, Mo and their alloys, are formed on the insulating substrate 10 by sputtering. Then, the gate insulating film 12 and the non-crystalline silicon film are deposited on the entire surface by CVD. Then, the non-crystalline silicon film is transformed into a polycrystalline silicon film upon irradiation of the non-crystalline silicon film by an excimer laser. Then, the polycrystalline silicon film is patterned to form the isolated active layers 13, 43.

Ion doping is performed to from a channel 13c in the active layer 13 located above the gate electrode 11 and to form the drain 13d and the source 13s at both sides of the channel 13c. Another ion doping is performed to from a channel 43c in the active layer 43 located above the gate electrode 41 and to form the drain 43d and the source 43s at both sides of the channel 43c.

Then, the interlayer insulating film 15 is deposited using CVD by sequentially depositing the $SiO_2$ film, the SiN film, and the $SiO_2$ film over the entire surface of the gate insulating film 12 and the active layers 13, 43. The contact holes corresponding to the drain 13d of the switching TFT 30 and the drain 43d of the driving TFT 40 are formed in the interlayer insulating film 15. The drain electrode 16, which also functions as the drain signal line 52, is formed at the switching TFT 30, and the driving power supply line 53 connected to the driving source is formed at the driving TFT 40, by filling the respective holes with a metal such as Al.

Furthermore, the planarization layer 17 made of an organic resin for flattening the surface is deposited on the entire surface. Then, a contact hole is formed in the planarization layer 17 at the location corresponding to the source 43s of the driving TFT 40. Then, the anode 61 made of ITO or the like, which makes a contact with the source 43s through the contact hole, is formed by sputtering.

Secondly, the hole transport layer 62, the light emitting layer 63 and the electron transport layer 64 are sequentially deposited by evaporation on the anode 61. The light emitting layers 63 of the display pixel are sequentially deposited on the corresponding anodes 61 in the order of R, G, and B pixels to form a matrix configuration. The material for the first color (R) is first evaporated to form the corresponding light emitting layers 63, using a metal mask made of a nickel alloy or the like with openings arranged in the corresponding matrix configuration, and the electron transport layers 64 are deposited on the light emitting layers 63. Then, the mask is moved in longitudinal or lateral direction to a next deposition position. Next, the materials for the other colors (G, B) are consecutively evaporated to form the corresponding light emitting layers 63 and the electron transport layer 64s, respectively.

Thirdly, Al is evaporated on the EL layer 65 to form the cathode 66 that is 4000 Å thick. It is not proper to use sputtering to form the cathode 66, because sputtering often induces damages to the EL layer 65, as described above. The cathode 66 covers the entire area of the insulating substrate 10.

Fourthly, the protection film 80 is deposited on the cathode 66 at the thickness of 500 Å by sputtering. The protection film 80 covers the edge side of the cathode 66 and the EL layer 65 as well as the entire top surface of the cathode 66, as shown in FIG. 5. Since the cathode 66 works as a protection film for the EL layer 65 during the sputtering, the physical shock from the sputtering dos not cause any damage to the EL layer 65. However, the sputtering of the protection layer 80 may still cause damage to the EL layer 65 if the thickness of the cathode 66 is too small. For example, if the thickness of the cathode 66 is about 1000 Å, a large hole can be formed in the cathode 66 and the EL layer 65 underneath may be damaged by the sputtering through this large hole. Accordingly, it is preferable to form the cathode 66 having the thickness of 4000 Å.

Finally, the sealing substrate 20 shown in FIG. 5 is attached to the insulating substrate 10 using an adhesive. A desiccant is included in the space sealed between the two substrates to absorb moisture that is taken in the sealed space during the attaching of the two substrates. This completes the manufacturing of the EL display device of this invention.

It is preferable to continuously perform the deposition of the cathode 66 and the deposition of the protection film 80 without breaking the vacuum between the two depositions. This may be achieved by performing multiple depositions in the same chamber or using a deposition apparatus with multiple chambers. If the cathode 66 is exposed to the air before the formation of the protection film 80, the moisture in the air may be adsorbed by the cathode 66 and may penetrate into the EL layer 65 through the defects 67. In this embodiment, multiple-chamber deposition apparatuses 100 shown in FIGS. 7A and 7B are used.

Figure 7A:
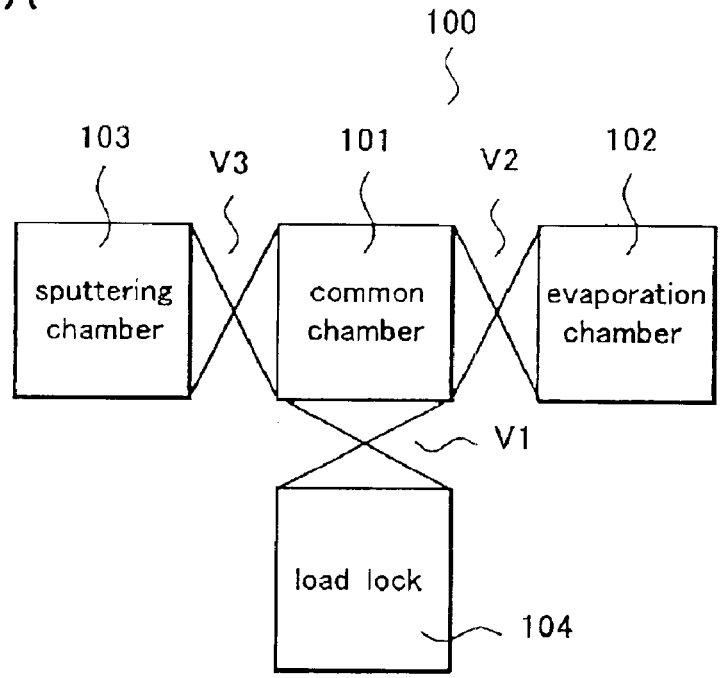
FIGS. 7A and 7B show schematic configurations of two continuous film deposition chambers.
Figure 7B:
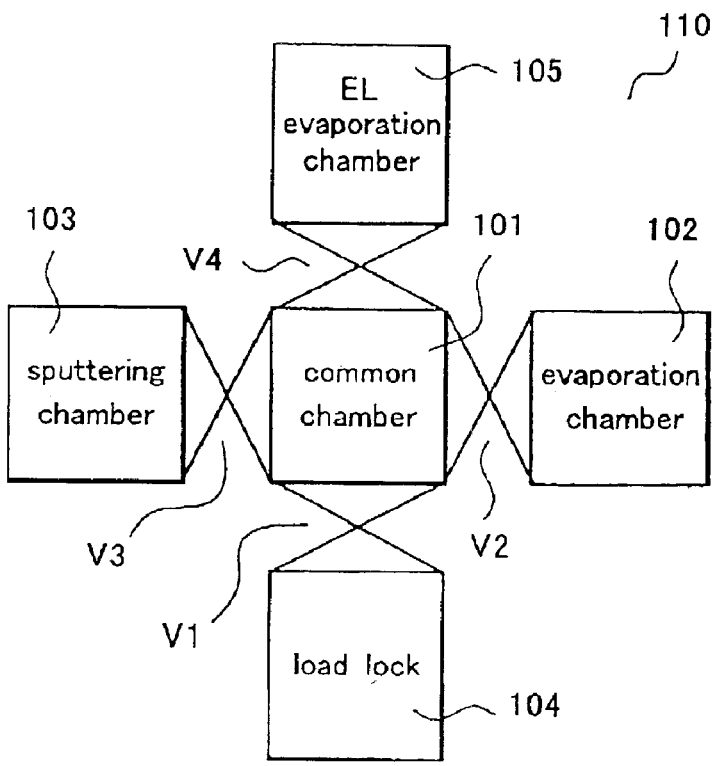

The multiple-chamber apparatus 100 shown in FIG. 7A has an evaporation chamber 102 connected to the common chamber 101, a sputtering chamber 103 (or a CVD chamber if the protection film is deposited by CVD), and a load lock 104. First, the insulating substrate 10 having the transistors and other device components thereon is placed in the load lock 104 and the chamber is evacuated. Alternatively, all the chambers may be evacuated simultaneously by leaving the valves V1, V2, and V3 open. Then, the substrate is transported to the evaporation chamber 102 through the common chamber 101. The valve V2 is closed for performing the evaporation of the cathode 66. The valve V2 is opened after removing the remaining evaporated gas from the chamber 102. The substrate is then transported to the sputtering chamber 103 for the formation of the protection film 80 through the common chamber 101. When there is a plurality of the substrates, they are temporally kept in the common chamber 101, and then the evaporation and the sputtering are performed on the corresponding substrates by closing the valves V2, V3, respectively.

Thus, the substrates can be processed without exposing them to the air.

In addition, an EL evaporation chamber may replace the sputtering chamber 103, enabling the continuous forming of the EL layer 65 and the cathode 66 without breaking the vacuum.

FIG. 7B shows a multiple-chamber deposition apparatus 110 which includes an EL evaporation chamber 105 connected to the multiple-chamber deposition apparatus 100 of FIG. 7A. The continuous depositions of the EL layer 65, the cathode 66 and the protection film 80 are performed using this multiple-chamber deposition apparatus 110, without breaking the vacuum. It is preferable to form layers without exposing the substrate to the air after the deposition of the EL layer 65. However, when a deposition apparatus having a plurality of deposition chambers is used in the manufacturing process, as many deposition steps have to be held during an maintenance of the deposition chamber. This may reduce the overall through put. Accordingly, the selection of the manufacturing apparatus should be made by taking the yield of the film deposition and the overall through put into consideration from the following options: 1) the third and the forth steps are performed continuously using the apparatus shown in FIG. 7A, 2) the second and third steps are performed continuously using the apparatus shown in FIG. 7A, and 3) the second, the third and the forth processes are continuously performed using the apparatus shown in FIG. 7B.

The EL display device of this embodiment is a bottom emission type, in which light is emitted from the transparent insulating substrate. Therefore, the brightness of the emission, or the emission rate, will not be affected by the non-transparent protection film formed on the cathode.

What is claimed is:

1. An electroluminescent display device comprising:
   a substrate;
   an electroluminescent element disposed over the substrate, the electroluminescent element comprising a first electrode disposed over the substrate, a second electrode disposed over the first electrode and a light emitting layer disposed between the first and second electrodes;
   a thin film transistor driving the electroluminescent element; and
   a protection film disposed over the second electrode and configured to prevent a penetration of moisture into the electroluminescent element.

2. The electroluminescent display device of claim 1, wherein a thickness of the protection film is equal to or greater than 20 Å and is equal to or smaller than a thickness of the second electrode.

3. The electroluminescent display device of claim 1, wherein a thickness of the protection film and a thickness of the second electrode are arranged so that a stress generated in the protection film upon formation of the protection film on the second electrode is equal to or smaller than a stress generated in the second electrode upon the formation of the protection film on the second electrode.

4. The electroluminescent display device of claim 1, 2 or 3, wherein the second wherein the second electrode is made of a metal that is deposited by evaporation.

5. The electroluminescent display device of claim 4, wherein the protection film comprises a film deposited by sputtering.

6. The electroluminescent display device of claim 1, 2 or 3, wherein the substrate is transparent enough to allow light emission through the substrate.

7. An electroluminescent display device comprising:
   a substrate;
   an electroluminescent element disposed over the substrate, the electroluminescent element comprising a first electrode disposed over the substrate, a second electrode disposed over the first electrode and a light emitting layer disposed between the first and second electrodes;
   a thin film transistor driving the electroluminescent element; and
   a protection film disposed over the second electrode and having a relative density higher than a relative density of the second electrode.

8. The electroluminescent display device of claim 7, wherein a thickness of the protection film is equal to or greater than 20 Å and is equal to or smaller than a thickness of the second electrode.

9. The electroluminescent display device of claim 7, wherein a thickness of the protection film and a thickness of the second electrode are arranged so that a stress generated in the protection film upon a formation of the protection film on the second electrode is equal to or smaller than a stress generated in the second electrode upon the formation of the protection film on the second electrode.

10. The electroluminescent display device of claim 7, 8 or 9, wherein the second electrode is made of a metal that is deposited by evaporation.

11. The electroluminescent display device of claim 10, wherein the protection film comprises a film deposited by sputtering.

12. The electroluminescent display device of claim 7, 8 or 9, wherein the substrate is transparent enough to allow light emission through the substrate.

13. The electroluminescent display device of claim 7, wherein the protection film is made of a metal that has a melting point higher than 1085° C.

14. An electroluminescent display device comprising:
   a substrate;
   a plurality of electroluminescent elements disposed over the substrate, each of the electroluminescent elements comprising an anode disposed over the substrate and a light emitting layer disposed over the anode;
   a cathode disposed over the light emitting layers of the electroluminescent elements;
   a thin film transistor disposed on the substrate for each of the electroluminescent elements; and
   a protection film disposed over the cathode and being configured to prevent a penetration of moisture into the electroluminescent elements.

15. The electroluminescent display device of claim 14, wherein the protection film covers a side edge portion of the cathode.

16. The electroluminescent display device of claim 14, further comprising a sealing substrate disposed over the protection film.

17. The electroluminescent display device of claim 14, wherein the protection film covers the cathode and the thin film transistor.

18. The electroluminescent display device of claim 1 or 7 wherein a thickness of the protection film is smaller than or equal to a half of a thickness of the second electrode.

* * * * *